(12) United States Patent
Wong et al.

(10) Patent No.: US 8,193,634 B2
(45) Date of Patent: Jun. 5, 2012

(54) MOUNTED SEMICONDUCTOR DEVICE AND A METHOD FOR MAKING THE SAME

(76) Inventors: Andre Wong, Santa Clara, CA (US); Sukbhir Bajwa, Milpitas, CA (US)

( * ) Notice: Subject to any disclaimer, the term of this patent is extended or adjusted under 35 U.S.C. 154(b) by 104 days.

(21) Appl. No.: 12/880,025

(22) Filed: Sep. 10, 2010

(65) Prior Publication Data

US 2011/0090927 A1   Apr. 21, 2011

Related U.S. Application Data

(62) Division of application No. 12/167,125, filed on Jul. 2, 2008, now Pat. No. 7,816,155.

(60) Provisional application No. 60/948,300, filed on Jul. 6, 2007.

(51) Int. Cl.
*H01L 21/00* (2006.01)

(52) U.S. Cl. ............ 257/717; 257/735; 257/E23.006; 257/E23.101; 257/E23.111; 257/E29.022

(58) Field of Classification Search ............ 257/98.99, 257/717, 735, E23.006, 101, 111, 29.022
See application file for complete search history.

(56) References Cited

U.S. PATENT DOCUMENTS

| | | | | |
|---|---|---|---|---|
| 3,593,070 A | * | 7/1971 | Reed | 257/735 |
| 6,335,863 B1 | * | 1/2002 | Yamamoto et al. | 361/719 |
| 6,895,027 B2 | * | 5/2005 | Treusch et al. | 372/36 |
| 7,811,903 B2 | * | 10/2010 | Grigg et al. | 438/459 |

* cited by examiner

*Primary Examiner* — Michael Lebentritt
(74) *Attorney, Agent, or Firm* — Matthew A. Pequignot; Pequignot + Myers LLC

(57) ABSTRACT

A method for mounting a semiconductor device onto a composite substrate, including a submount and a heat sink, is described. According to one aspect of the invention, the materials for the submount and the heat sink are chosen so that the value of coefficient of thermal expansion of the semiconductor device is in between the values of coefficients of thermal expansion of the materials of the submount and the heat sink, the thickness of the submount being chosen so as to equalize thermal expansion of the semiconductor device to that of the surface of the submount the device is mounted on. According to another aspect of the invention, the semiconductor device, the submount, and the heat sink are soldered into a stack at a single step of heating, which facilitates reduction of residual post-soldering stresses.

12 Claims, 8 Drawing Sheets

MOUNTED SEMICONDUCTOR DEVICE AND A METHOD FOR MAKING THE SAME

CROSS-REFERENCE TO RELATED APPLICATIONS

The present application is a divisional application of U.S. patent application Ser. No. 12/167,125, filed on Jul. 2, 2008 now U.S. Pat. No. 7,816,155, entitled "A Mounted Semiconductor Device And A Method For Making The Same", which claims priority from U.S. Provisional Patent Application No. 60/948,300 filed Jul. 6, 2007, entitled "A Cost Effective Method Of Mounting High Power Optical Devices On Mismatched Substrates", each of which are incorporated herein by reference for all purposes.

TECHNICAL FIELD

The present invention is related to mounting of planar semiconductor devices, and in particular to low-stress mounting of semiconductor laser diodes onto thermally mismatched heat sinks.

BACKGROUND OF THE INVENTION

Planar semiconductor devices including patterned thin film structures formed on a semiconductor substrate can generate a considerable amount of heat during normal operation. For example, a single emitter laser diode chip rated at 5 W of output radiation at an efficiency of 40%, will generate 3 W of heat during operation at full rated power. This heat needs to be removed to prevent overheating and failure of the device.

Heat removal is achieved by mounting a semiconductor device onto a heat sink made of a material having a good thermal conductivity, e.g. copper. Once the heat is transferred to the copper heat sink, it can be removed by cooling the heat sink with, for example, a Peltier cooler. It is therefore essential to ensure a good thermal contact between a semiconductor device and a heat sink. In order to provide such a contact, and also to ensure that the device is mounted in a reliable and stable fashion, soldering is often used.

Soldering a semiconductor device, especially a radiation-emitting semiconductor device such as a laser diode, to a copper heat sink has a serious drawback. A laser diode chip has to be mounted at a certain position relative to a collimating lens. A shift of the chip relative to the lens degrades a laser performance and should be avoided. To avoid creeping of laser diode chip during operation or storage at varying temperatures, a hard solder is frequently used. However, soldering of a semiconductor device on a GaAs or a silicon substrate, having relatively small coefficient of thermal expansion, to copper having a large coefficient of thermal expansion, with a hard solder creates a significant amount of residual stress in the semiconductor device, which greatly reduces reliability of the latter. A material with a coefficient of thermal expansion matching that of the semiconductor device can be used to reduce the stress to a low enough value. For example, copper-tungsten (CuW) alloy is used in prior art to match the coefficient of thermal expansion of gallium arsenide (GaAs). However, thermally matching alloys are often expensive to make and difficult to process.

An alternative approach established in the prior art is based on employing a submount, placed between a semiconductor device and a heat sink, for better thermal matching between the semiconductor device and the surface it is mounted on. To reduce the residual stress in a semiconductor device mounted on a submount, Mochida et al., in US20050127144A1 which is incorporated herein by reference, describe various techniques using pressure bonding and, or creating temperature gradients, to offset the residual stresses generated upon cooling the compound heat sink. Further, Moriya et al., in U.S. Pat. No. 6,961,357 which is incorporated herein by reference, optimize a shape of a submount to reduce residual stress at a particular point, corresponding to the light emitting region of a mounted laser diode chip, to a value lower than 20 MPa, which is considered in U.S. Pat. No. 6,961,357 to be a threshold value of stress above which a defect rate increases considerably (see FIG. 5 of said Patent document). Still yet further, Yamane et al., in US20040201029A1 which is incorporated herein by reference, describe various methods of applying soldering compounds aiming at minimizing the melting point of compound solder films, to lower soldering temperature, and to lower the residual mechanical stresses correspondingly.

The abovementioned approaches utilizing a submount for relieving the stress in a semiconductor device share common problems. Mounting methods employing a submount require an extra process step of mounting the submount on a heat sink, or mounting the semiconductor device to the submount, whichever step is done first. A special mounting equipment needs to be developed, for example, in case of US20050127144A1 by Mochida et al., a heated mounting chuck (collet) needed to be developed. More complicated mounting process and utilization of special materials for precise thermal matching of submount to the semiconductor device increase manufacturing time and cost, as compared to mounting of semiconductor devices directly onto a copper heat sink.

It is therefore an object of the present invention to provide a method for mounting a semiconductor device allowing one to considerably lower the levels of residual mechanical stress in a mounted semiconductor device without having to use expensive or difficult to machine submount materials or adding new major steps in the manufacturing process. Further, it is an object of the present invention to provide a mounted semiconductor device having low levels of the residual mechanical stress, lower than 20 MPa and, preferably, lower than 10 MPa.

The device and method of present invention meet the above stated objectives. Not only that, but the method of the present invention allows one to use a hard solder having relatively high melting point, to ensure a high mechanical stability and reliability of a mounted device.

SUMMARY OF THE INVENTION

In accordance with the invention there is provided a method for low-stress mounting of a planar semiconductor device, comprising:

providing a heat sink having a flat surface and a submount having two opposing first and second flat surfaces, wherein two of three said surfaces have solder films adhered thereon;

cold contacting the flat surface of the heat sink to the first flat surface of the submount, and cold contacting the second flat surface of the submount to a flat surface of the planar semiconductor device, so as to form a stack, wherein the solder films are disposed on both sides of the submount;

melting the solder films on both sides of the submount; and allowing the solder films to cool and solidify;

wherein the planar semiconductor device, the submount, and the heat sink have first, second, and third coefficients of thermal expansion CTE1, CTE2, and CTE3, respectively, wherein said coefficients of thermal expansion are measured in a direction parallel to said flat surfaces, and wherein the value of CTE1 is in between the values of CTE2 and CTE3.

In accordance with another aspect of the invention there is further provided a mounted semiconductor device, comprising:
a heat sink having a flat surface, a submount having two opposing first and second flat surfaces, and a planar semiconductor device having a flat mounting surface, wherein the flat surface of the heat sink is soldered to the first flat surface of the submount using a first solder film, and the second flat surface of the submount is soldered to the flat mounting surface of the planar semiconductor device using a second solder film, so as to form a stack;
wherein the planar semiconductor device, the submount, and the heat sink have first, second, and third coefficients of thermal expansion CTE1, CTE2, and CTE3, respectively, wherein said coefficients of thermal expansion are measured in a direction parallel to said flat surfaces, and wherein CTE3>CTE1>CTE2 or CTE3<CTE1<CTE2.

BRIEF DESCRIPTION OF THE DRAWINGS

Exemplary embodiments will now be described in conjunction with the drawings in which.

DETAILED DESCRIPTION OF THE INVENTION

While the present teachings are described in conjunction with various embodiments and examples, it is not intended that the present teachings be limited to such embodiments. On the contrary, the present teachings encompass various alternatives, modifications and equivalents, as will be appreciated by those of skill in the art.

Figure 1:
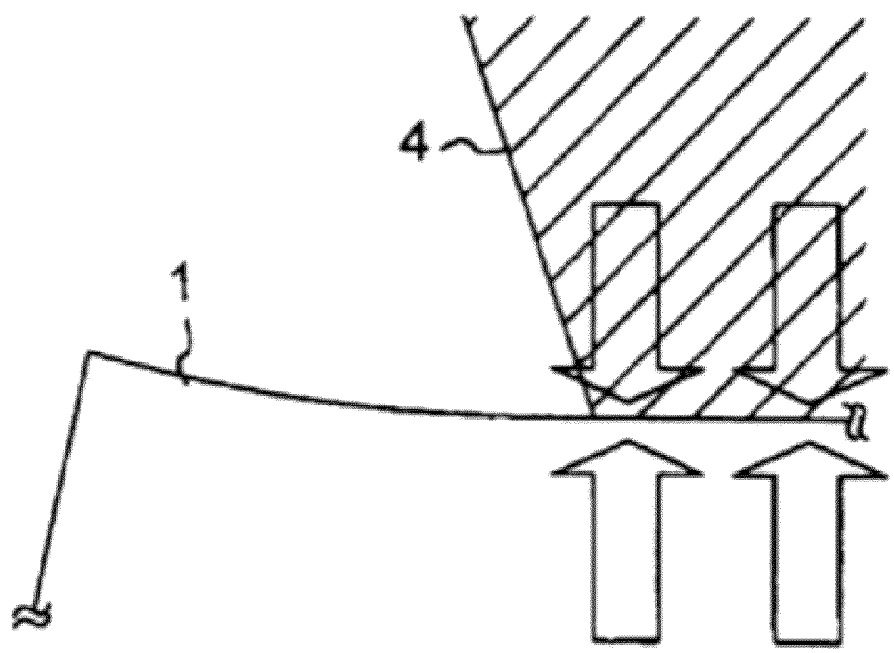
FIG. 1 is a diagram illustrating a prior art laser diode mounting method.

Referring to FIG. 1, a prior art method of mounting of a laser diode chip on a submount is illustrated. A vacuum chuck, or collet 4 used to hold a semiconductor laser component 1, is heated to prevent a heat flow to the collet 4 during soldering. Alternatively, collet 4 is used to exert a pressure on the component 1 so as to bend it in a direction opposite to a direction of bend which would occur as a result of a residual stress building up upon cooling of a soldering joint between a laser diode chip and a thermally mismatched submount (not shown). The direction of pressure is shown in FIG. 1 symbolically with arrows. As a result of applying pressure during soldering, the total residual mechanical stress is reduced.

The method of the present invention advantageously differs from the method of FIG. 1 in that no external pressure is required to reduce the mechanical stress of the mounted device. The mechanical stress appears when two parts, expanding or contracting to a different extent upon a change in the parts' temperature, are joined together by soldering. Upon solder hardening, which occurs at a temperature close to the melting temperature, or melting point of the solder, the parts which have been soldered begin to shrink at a different rate. Since the parts are firmly attached together by the solidified layer of solder, a stress appears. A quantitative measure of a degree of expansion of a material upon increase of the temperature of the material is the material's coefficient of thermal expansion (CTE). It is conveniently defined as a relative change in a linear size upon increase of the temperature by one degree. For example, it can be measured in parts per million per degree Celsius.

Figure 2A:
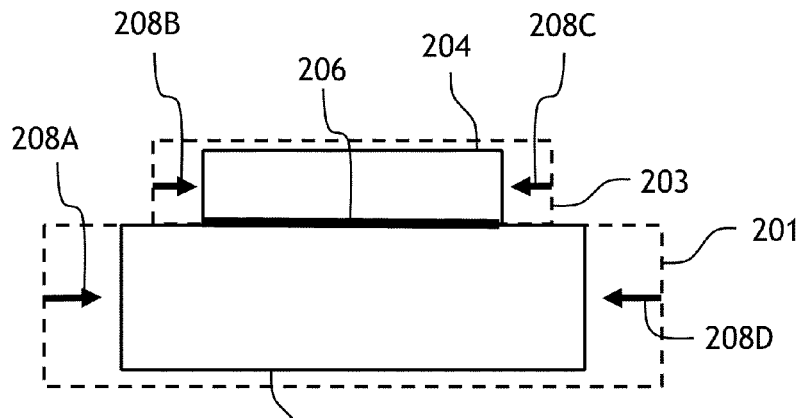
FIGS. 2A and 2B are side views of a thermally matched and a thermally mismatched heat sink—submount assemblies, respectively.
Figure 2B:
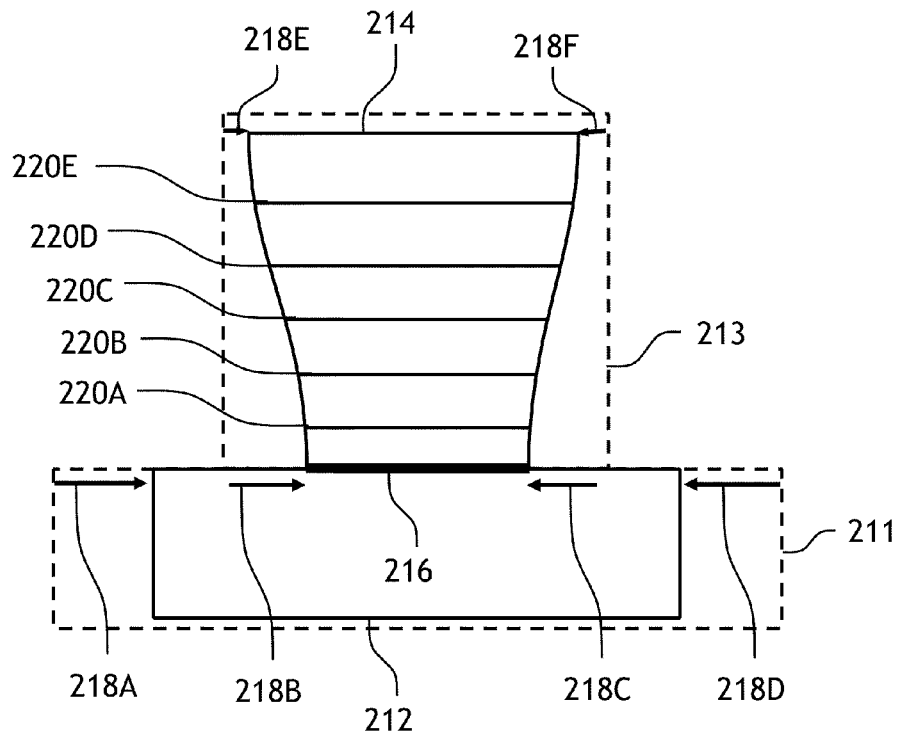

FIGS. 2A and 2B illustrate one aspect of the present invention, showing how a coefficient of thermal expansion of a surface of a submount can be tuned without having to change the material composition of the submount. In FIG. 2A, a heat sink 202 supports a submount 204 soldered to heat sink 202, wherein a line 206 denotes the solder layer. The coefficients of thermal expansion of heat sink 202 and submount 204 are perfectly matched in this example. During soldering, which occurs at an elevated temperature, both the heat sink 202 and the submount 204 are expanded, as is symbolically shown with rectangles 201 and 203, respectively. Upon cooling down, both parts shrink as shown with arrows 208A, 208B, 208C, and 208D. Due to matching of the coefficients of thermal expansion, no significant stress is formed in submount 204. This occurs because the surfaces of heat sink 202 and submount 204 shrink upon cooling by the same relative amount, and the residual stress due to mismatch of thermal expansion coefficients of the solder layer 206 and the submount 204 is small.

Turning now to FIG. 2B, an example is shown of a submount 214 soldered to a heat sink 212, wherein a line 216 denotes the solder layer. In this example, heat sink 212 has a coefficient of thermal expansion larger than that of submount 214. During soldering, which occurs at an elevated temperature, both the heat sink 212 and the submount 214 are expanded, as is symbolically shown with rectangles 211 and 213, respectively. Upon cooling down, both parts shrink as shown with arrows 218A, 218B, 218C, 218D, 218E, and 218F. Since the coefficient of thermal expansion of heat sink 212 is larger than that of submount 214, heat sink 212 will shrink more upon cooling, in terms of a percentage of shrinking, than submount 214. However, since during shrinking the solder layer 216 is already solidified, the lower part of submount 214 will shrink at a higher rate than the higher part of said submount. This is symbolically represented in FIG. 2B by arrows 218E and 218F, illustrating shrinking of the upper part of submount 214, being smaller than the arrows 218B and 218C, illustrating shrinking of the bottom part of submount 214 soldered to heat sink 212 with solder layer 216. Lines 220A-220E represent various degrees of shrinkage of a top surface of submount 214, if the submount was made thinner so that the lines 220A-220E denote the upper surface of submount 214. For example, if the submount was cut at a level shown by line 220A, the coefficient of thermal expansion of the upper surface of the submount would approximate that of the heat sink 212. If, on the other hand, the submount was cut at a higher level shown by line 220B, or by line 220C, or by line 220D, or by line 220E, the coefficient of thermal expansion of the upper surface of the submount would be progressively smaller, approaching the coefficient of thermal expansion of the bulk material of submount 214. Therefore, the value of the effective coefficient of thermal expansion of the upper surface of submount 214 can be adjusted anywhere within a range between the value of coefficient of thermal expansion of heat sink 212 and that of submount 214, by adjusting the thickness of submount 214. If a coefficient of thermal expansion (CTE) of a semiconductor device to be mounted on submount 214 is in the range between that of the heat sink 212 and the CTE of submount 214, a nearly perfect thermal matching of the device to submount 214 is possible. Thus, according to the present invention, the relationship between the coefficients of thermal expansion of the materials of a semiconductor device, a submount, and a heat sink, denoted as CTE1, CTE2, and CTE3, respectively, can be expressed as $$CTE3 > CTE1 > CTE2 \quad (1)$$

or, for heat sinks with the coefficient of thermal expansion smaller than that of the semiconductor device, $$CTE3 < CTE1 < CTE2 \quad (2)$$

Figure 3:
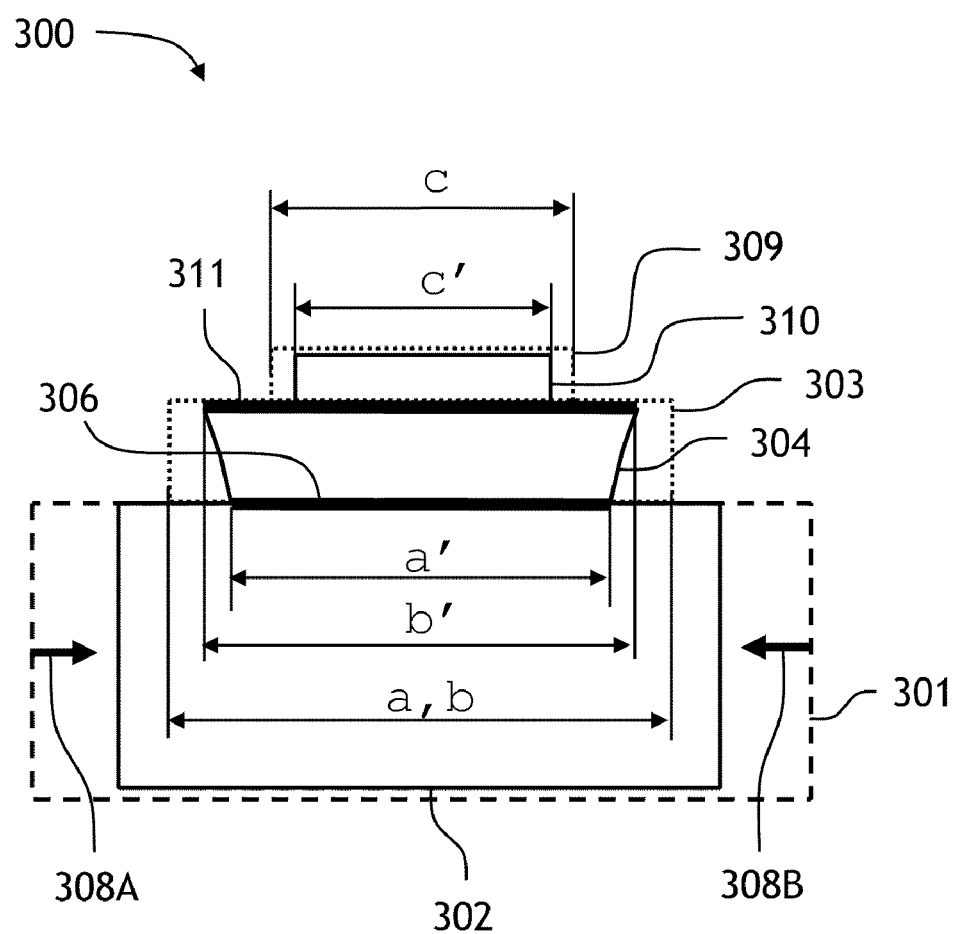
FIG. 3 is a side view of a mounted semiconductor device according to the present invention.

Referring now to FIG. 3, a principle of thermal matching according to one aspect of the present invention is further illustrated. In a stack 300, a submount 304 is soldered to a heat sink 302, the solder layer being denoted by a line 306. A planar semiconductor device 310 is soldered to submount 304 via a solder layer 311. The relationship between coefficients of thermal expansion of the materials of heat sink 302, submount 304, and the semiconductor device 310 is described by the above condition (1), wherein the coefficient of thermal expansion of the submount 304 is the smallest of the three, and the coefficient of thermal expansion of the heat sink 302 is the largest. The shape of heat sink 302 during soldering is shown with a dashed-line rectangle 301, and the shapes of submount 304 and planar semiconductor device 310 are shown with dotted-line rectangles 303 and 309, respectively. Both solder layers 306 and 311 have the same melting temperature, or melting point, and are melted during a single heating step. Upon cooling of stack 300, both solder layers 306 and 311 solidify approximately at the same time, after which time the submount 304 starts to experience stress because its bottom surface contacting solder layer 306 shrinks faster than the top surface contacting solder layer 311. The thickness of submount 304 is chosen so that the effective coefficient of thermal expansion of its upper surface approximates that of planar semiconductor device 310, as has been explained above. The condition of thermal matching of a stack 300 of FIG. 3 can be therefore recorded as $$(c'-c)/c = (b'-b)/b, \quad (3)$$

wherein, according to condition (1) above, $$(b'-b)/b < (a'-a)/a \quad (4)$$

Figure 4A:
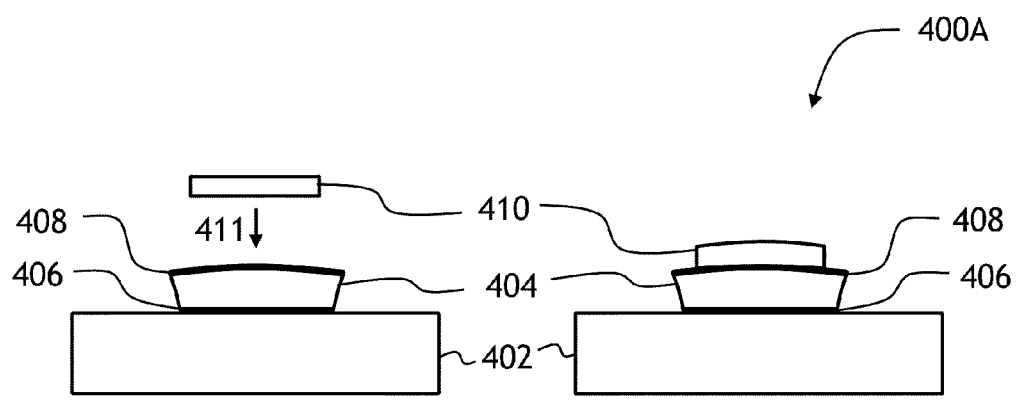
FIGS. 4A and 4B are side views of semiconductor devices mounted using different mounting methods.
Figure 4B:
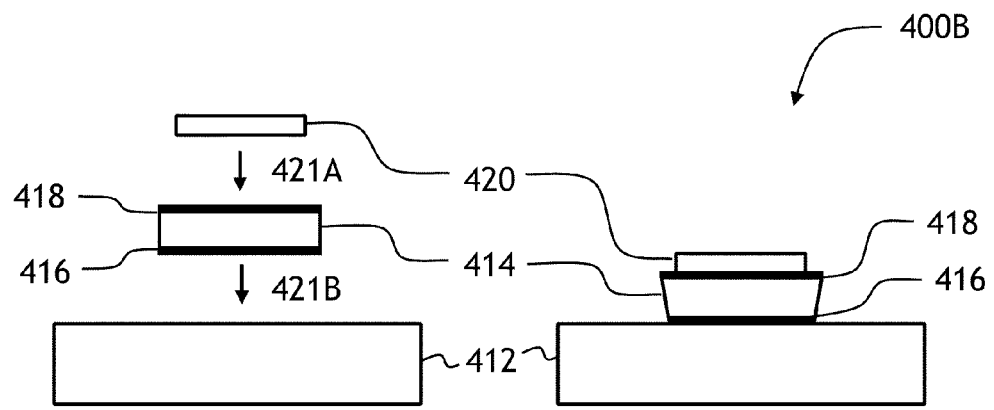

Turning now to FIGS. 4A and 4B, another aspect of a mounting method of the present invention is illustrated, by means of highlighting the differences between one mounting method, shown in FIG. 4A, and a preferred method of present invention, shown in FIG. 4B. In FIG. 4A, a stack 400A comprising a heat sink 402, a submount 404, and a semiconductor device 410 is formed in two separate soldering steps, the coefficients of thermal expansion satisfying condition (1) above. In a first step, submount 404 is soldered to heat sink 202 via a solder layer 406. Note that, because of thermal mismatch between heat sink 402 and submount 404, the latter will deform upon cooling down, and its upper surface coated with a solder layer 408 will distort and become convex. At a second step, a semiconductor device 410 is mounted on submount 404, as shown by an arrow 411, and stack 400A is heated again to melt solder layer 408. To prevent re-melting of solder layer 406, the melting point of solder layer 408 is chosen to be smaller than that of solder layer 406. During the second step of soldering of semiconductor device 410 to submount 404, the entire stack 400A is at a temperature lower than the melting point of the lower solder layer 406, and some curving of the upper surface of submount 404 is still present; therefore in the second step of soldering a flat semiconductor device 410 is soldered to a slightly curved surface of submount 404, resulting in a bending stress applied to semiconductor device 410 upon cooling down the stack at the end of the second step of soldering.

In contrast to the method of soldering of FIG. 4A, the preferred mounting method of the present invention, shown in FIG. 4B, involves a single step of soldering the entire stack 400B. Said stack 400B comprises a substrate 412, a submount 414, and a semiconductor device 420. Submount 414 contains two matched solder layers, 416 and 418, adhered to its opposing surfaces. Here, the word "matched" means that the two solder layers have essentially the same melting point. The thickness and the coefficient of thermal expansion of the material of submount 414 are chosen so that the conditions (1) and (3) above are fulfilled. The three parts 412, 414, and 420 are cold contacted, or joined together without heating, as shown by arrows 421A and 421B. Then, the entire stack is heated so as to melt the solder layers 416 and 418. Next, stack 400B is cooled down. Advantageously, during solidification of solder layers 416 and 418 the submount 414 is straight, that is, neither concave nor convex. Further, the condition (3) above is fulfilled, and as a result, upon solidification of solder layers 416 and 418 and cooling down stack 400B, submount 414 stays substantially straight. When stack 400B cools down, both normal and tangential components of residual mechanical stress in semiconductor component 420 are reduced, as compared to the levels of stress in stack 400a of FIG. 4A.

Figure 5A:
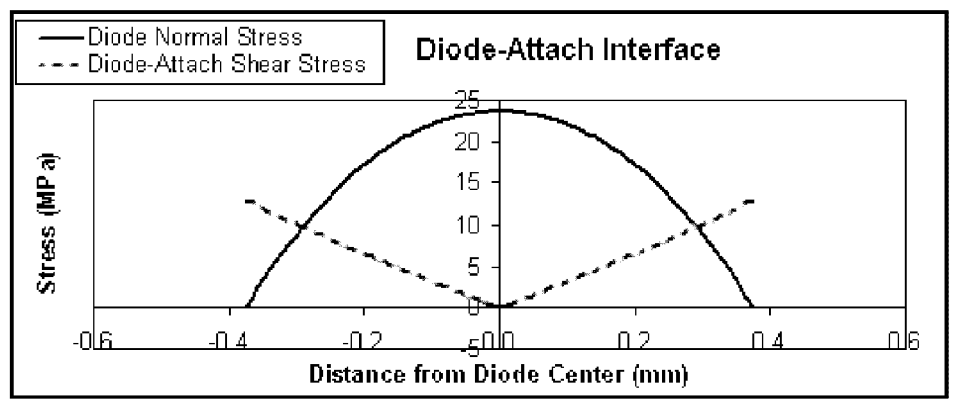
FIGS. 5A and 5B are plots of calculated stress in a semiconductor device mounted on a submount without and with a heat sink, respectively.
Figure 5B:
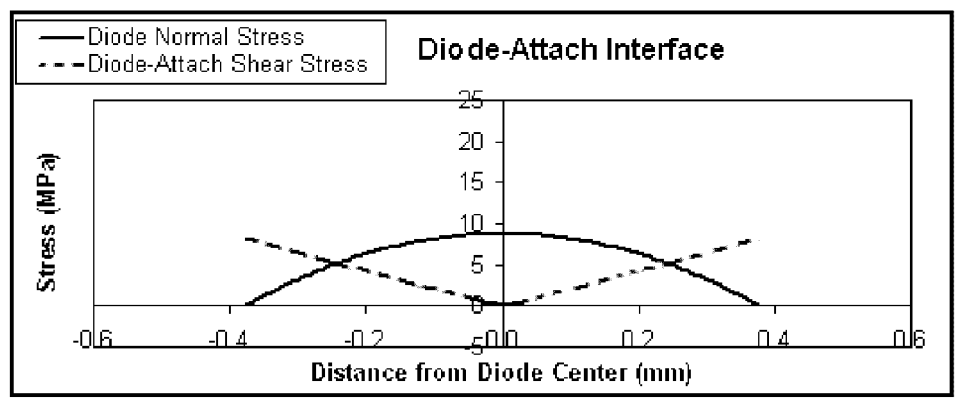

Turning now to FIGS. 5A and 5B, results of a computer simulation of a residual stress in a gallium arsenide (GaAs) semiconductor device soldered to a silicon carbide (SiC) submount are presented in a form of diagrams depicting a magnitude of a normal or bending stress, and a lateral or shear stress, as a function of a distance from center of the semiconductor device. FIG. 5A corresponds to the case when there is no copper heat sink present, while FIG. 5B corresponds to the case when the copper (Cu) heat sink, the submount, and the semiconductor device are soldered at the same time using the method of FIG. 4B, with the conditions (1) and (3) above met. The following assumptions are used in the calculations: the copper heat sink is 1 mm thick, the submount is 0.24 mm thick, and the semiconductor device is 0.1 mm thick; the solder is a gold-tin (Au—Sn) alloy with 70% of Au and 30% of Sn, and the maximum heating temperature is 297° C. The coefficients of thermal expansion of materials of the heat sink, the submount, and the semiconductor device were taken to be $17*10^{-6}/°$ C.; $2.8*10^{-6}/°$ C.; and $5.7*10^{-6}/°$ C., respectively. One can see that, at the selected set of coefficients of thermal expansion, the condition (1) above is satisfied. By comparing FIGS. 5A and 5B, one can see that the mounting method according to the present invention allows one to lower residual stresses considerably. Both a shear stress and in particular normal stress decrease to a level of below 10 MPa, wherein the shear stress decreases by approximately 2 times, and the normal stress decreases by almost 3 times. Thus, the diagram of FIG. 5B indicates that the mounting method of present invention presented in FIG. 4B results in a low-stress mounting of a semiconductor device onto a substrate made out of a thermally mismatched material.

The method of the present invention allows one to minimize residual stress in a semiconductor device being mounted by adjusting the thickness of a submount, as opposed to the prior art method of matching the bulk thermal expansion coefficients which often requires one to use customized expensive alloys such as copper-tungsten (CuW) alloy with a customized percentage of copper and tungsten. As a result, the present method can be advantageously used to mount semiconductor devices, such as GaAs laser diodes onto inexpensive ceramic substrates with the mismatch of thermal coefficient of expansion exceeding $2*10^{-6}/°$ C. At the same time, unexpectedly and advantageously, an inexpensive heat sink material having a high thermal expansion coefficient of over $15*10^{-6}/°$ C., such as copper, can be used.

An important aspect of the present invention is that the mounting be performed in a single soldering step. Single-step soldering allows one to further leverage the residual stress levels reduction by making sure that the submount and the semiconductor device are flat when the solder begins to solidify as a result of cooling the stack. When a single-step soldering is used, both normal and tangential components of residual stress of the semiconductor device are much lower than the value of an acceptable residual stress level of 20 MPa. GaAs laser diode chips having a thickness of 0.1 mm have been mounted onto a 0.24 mm thick SiC submount mounted onto a 1 mm thick copper heat sink using a single-step soldering, and manufacturing cost savings combined with excellent reliability of the mounted laser diodes have been demonstrated.

Figure 6:
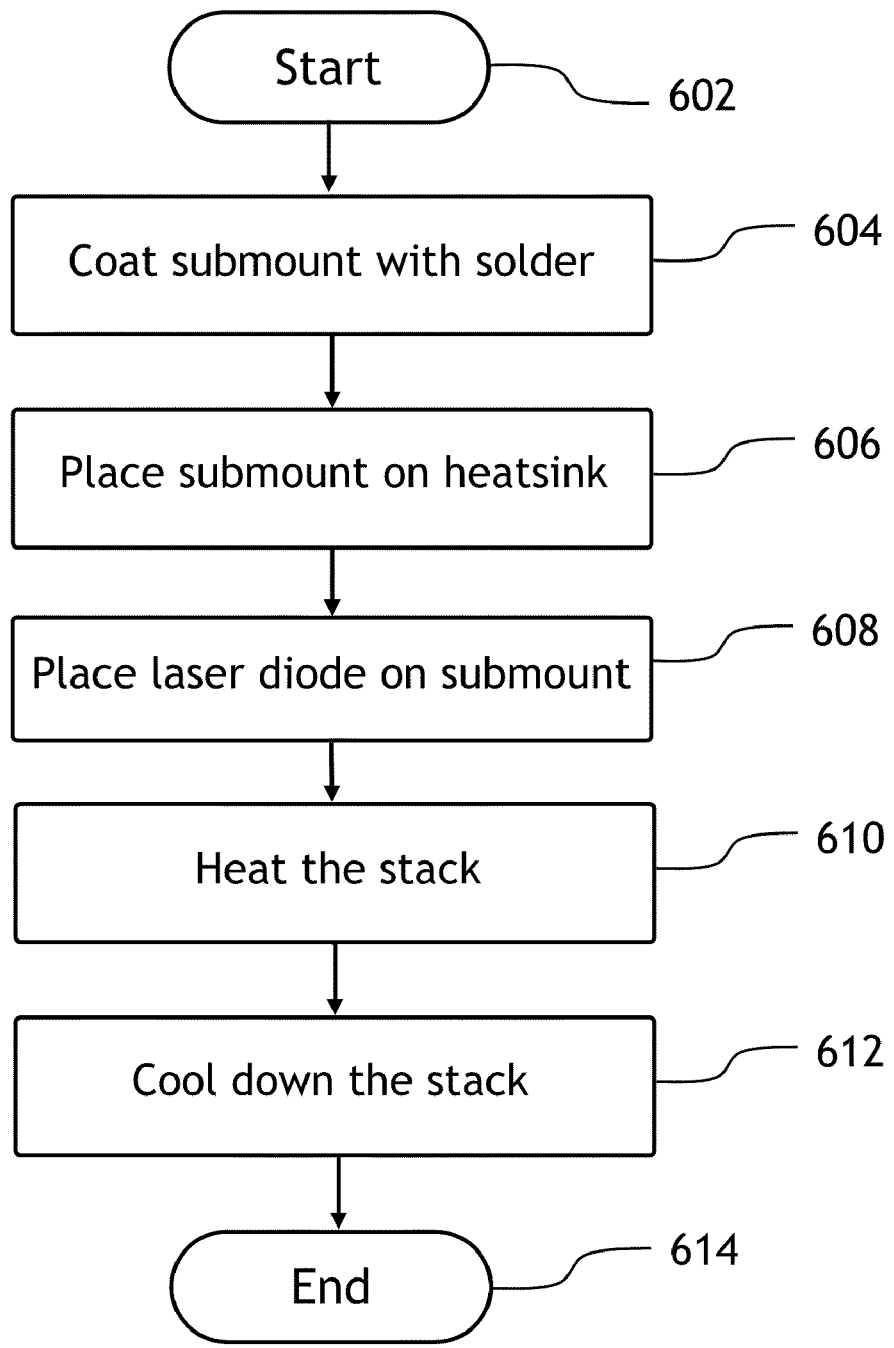
FIG. 6 is a flow chart of a process of mounting a laser diode on a heat sink according to the present invention.

Turning now to FIG. 6, a process diagram is presented for a process of mounting a planar semiconductor device, e.g. a laser diode chip, according to a method of FIG. 4B. In FIG. 6, a point 602 denotes the starting point of the process. A block 604 denotes the step of coating a submount with solder, on both sides of the submount. Preferably, the solder films are formed over a multilayer structure of deposited layers comprising, in the order of deposition of the layers, a 0.1 um thick titanium (Ti) layer; a 0.2 um thick platinum (Pt) layer; and a 0.5 um thick gold (Au) layer. Further, preferably, to ensure proper melting point, the solder layers, or solder films, are a gold-tin (AuSn) alloy solder films including 70%+−10% of Au and 30%−+10% of Sn. Yet further, preferably, the solder films are 4 um and 11 um thick. Then, at a step 606, the submount is placed onto a heat sink, with the 11 um thick solder film contacting the heat sink. At a step 608, the laser diode chip is placed on the submount. At a step 610, thereby formed stack is heated to 297° C. using a controlled conductive heating, for melting the solder films. After this step, the stack is left to cool down, or is cooled down using forced air. Finally, at a point 614, the process ends.

Figure 7:
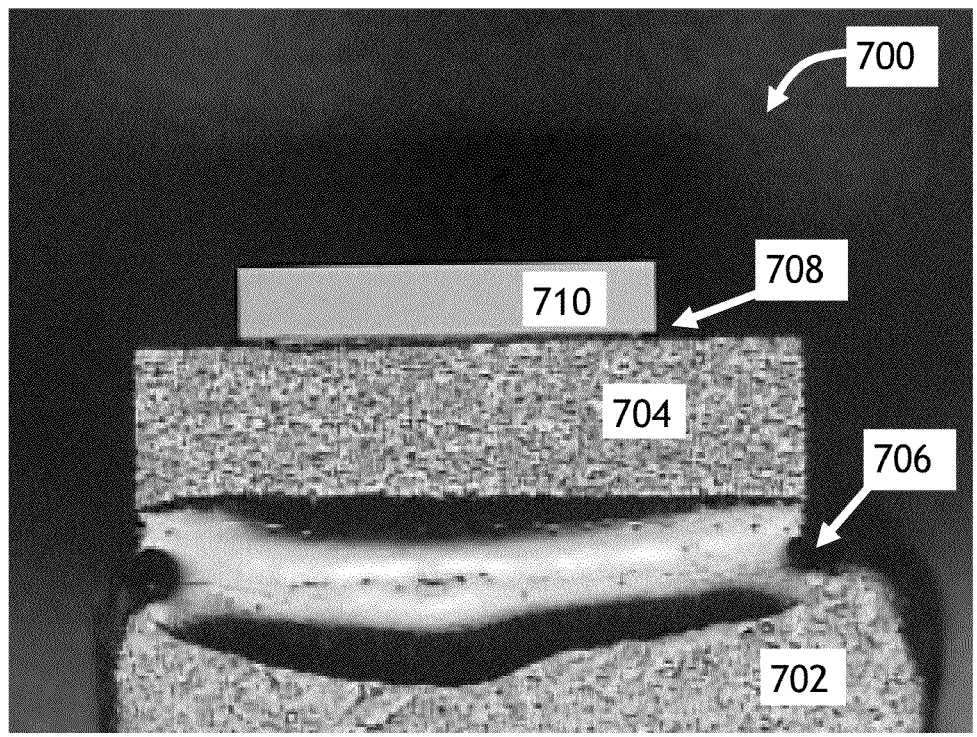
FIG. 7 is a front-view photograph of laser diode chip mounted using a method of present invention.

In FIG. 7, a front view microphotograph shows a mounted laser diode stack 700 comprising a copper heat sink 702, a silicon carbide submount 704, and a gallium arsenide (GaAs) laser diode chip 710. The stack is held together with solder layers 706 and 708.

Figure 8:
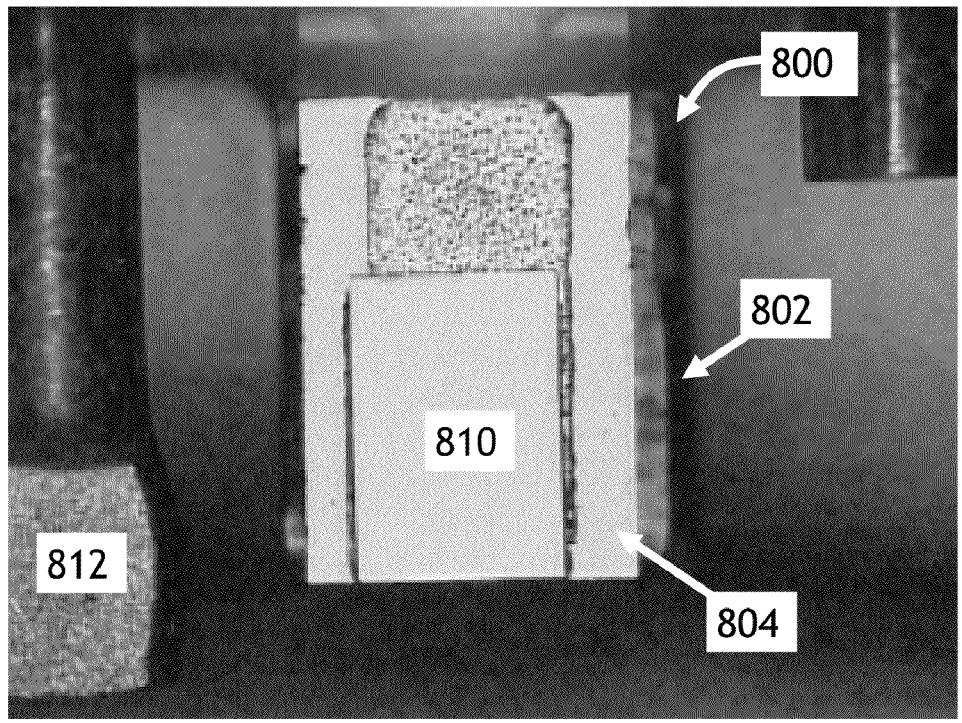
FIG. 8 is a top-view photograph of a laser diode chip mounted using a method of present invention.

A top view microphotograph of a mounted laser diode stack 800 in FIG. 8 shows a copper heat sink 802, a silicon carbide submount 804, and a laser chip 810. An electrode 812 is used to provide an electric current to the chip 810 using a wirebond, not shown.

The method of the present invention for mounting of a semiconductor device onto a substrate can be used to mount laser diodes, light emitting diodes, or any other planar semiconductor devices which generate heat during operation. Various materials can be used for a heat sink and a submount, for as long as conditions (1) or (2) above are fulfilled, together with condition (3). To reduce residual stress in a mounted semiconductor device according to a method of the present invention, the coefficient of thermal expansion of the semiconductor element has to have a value in between of the values of coefficients of thermal expansion of the heat sink and the submount. For example, when copper is used as a heat sink for a gallium arsenide semiconductor device, the coefficient of thermal expansion of the heat sink is larger than that of the semiconductor device. Therefore, a low-expansion submount, such as silicon carbide submount, should be used. On the other hand, when a low-expansion material, such as aluminum nitride, is used as a heat sink for a gallium arsenide device, a high-expansion submount can be used. In either case, the thickness of the submount is chosen so that the condition (3) above is fulfilled.

What is claimed is:

1. A mounted planar semiconductor device, comprising:
a heat sink having a flat surface, a submount having two opposing first and second flat surfaces, and a planar semiconductor device having a flat mounting surface, wherein the flat surface of the heat sink is soldered to the first flat surface of the submount using a first solder film, and the second flat surface of the submount is soldered to the flat mounting surface of the planar semiconductor device using a second solder film, so as to form a stack; wherein the planar semiconductor device, the submount, and the heat sink have first, second, and third coefficients of thermal expansion CTE1, CTE2, and CTE3, respectively, wherein said coefficients of thermal expansion are measured in a direction parallel to said flat surfaces, and wherein CTE3>CTE1>CTE2 or CTE3<CTE1<CTE2.

2. A mounted planar semiconductor device of claim 1, wherein the heat sink comprises copper (Cu); the submount comprises silicon carbide (SiC); the planar semiconductor device comprises gallium arsenide (GaAs); the solder films comprise a gold-tin alloy (AuSn), wherein the composition of the gold-tin alloy is as follows: Au (70+−10%); Sn (30−+10%).

3. A mounted planar semiconductor device of claim 1, wherein the residual mechanical stress in the planar semiconductor device is less than 20 MPa.

4. A mounted planar semiconductor device of claim 1, wherein the residual mechanical stress in the planar semiconductor device is less than 10 MPa.

5. A mounted planar semiconductor device of claim 1, wherein the heat sink is a header of a semiconductor device package.

6. A mounted planar semiconductor device of claim 1, wherein the planar semiconductor device is a laser diode.

7. A mounted planar semiconductor device of claim 1, wherein the planar semiconductor device is a light emitting diode (LED).

8. A mounted planar semiconductor device of claim 1, wherein the submount comprises aluminum nitride.

9. A mounted planar semiconductor device of claim 1, wherein CTE3>$15*10^{-6}/°$ C.

10. A mounted planar semiconductor device of claim 1, wherein CTE1-CTE2>$2*10^{-6}/°$ C.

11. A mounted planar semiconductor device of claim 1, wherein the first and the second solder films each have a melting point, and wherein the melting points of the two films are substantially equal to each other.

12. A mounted planar semiconductor device of claim 1, wherein the first and the second solder films each have a melting point, and wherein the melting points of the two films are within 10° C. of each other.

* * * * *